July 26, 1955 E. N. KATHER 2,714,178

TUNABLE MAGNETRONS

Filed May 26, 1951 2 Sheets-Sheet 1

INVENTOR
ERICH NEVIN KATHER
BY Elmer J. Gorn
ATTORNEY

July 26, 1955 E. N. KATHER 2,714,178

TUNABLE MAGNETRONS

Filed May 26, 1951 2 Sheets-Sheet 2

INVENTOR
ERICH NEVIN KATHER
BY Elmer J. Gorn
ATTORNEY

United States Patent Office 2,714,178

Patented July 26, 1955

2,714,178

TUNABLE MAGNETRONS

Erich Nevin Kather, South Lincoln, Mass., assignor to Raytheon Manufacturing Company, Newton, Mass., a corporation of Delaware Application May 26, 1951, Serial No. 228,401

9 Claims. (Cl. 315—39.61)

This invention relates to electron-discharge devices, and more particularly to discharge devices of the magnetron type.

In copending application, Serial No. 54,540, filed October 14, 1948, by Albert D. LaRue, now Patent No. 2,629,069, issued February 17, 1953, there is disclosed a tunable magnetron discharge device, wherein the tuning structure is made nonresonant over the range of operating frequencies of the device. This is accomplished by separating the tuning elements by slots, the length of the slots being substantially greater than a quarter-wave length of the desired operating frequency of the discharge device.

While the deep slotted tuner disclosed and claimed in the aforementioned application performs satisfactorily, the length of the tuner slots requires a relatively large amount of space in the magnetron discharge device.

Furthermore, since the tuning elements, due to the length of the slots, are positioned at the ends of relatively long fingers, such a tuning structure has certain mechanical disadvantages. For example, the tuning elements may tend to vibrate at the end of the fingers, and the tuning elements may be relatively easily bent during assembly of the discharge device, thereby increasing the danger of shorting of the tuning elements on the magnetron anode vanes.

This invention discloses the discovery that the resonance conditions encountered in the tuner in the form of a plurality of spaced resonant modes may be prevented from interfering with the operating frequency of the discharge device by separating the modes into two groups, one group positioned above and the other group positioned below the operating frequency of the discharge device. Briefly, this is accomplished by making different slots between the tuning elements of respectively different dimensions.

Specifically, this invention discloses that, if alternate slots between the tuning elements are made longer than the slots adjacent thereto, two separate and distinct groups of resonant modes will occur in the tuning structure. One group of modes will have frequencies which lie below the operating frequency of the magnetron-discharge device over the desired tunable band of said device, and the other group of modes will have frequencies which lie above said operating frequency of the device.

While a complete and precise explanation of this prenomenon is not available, the operation may be considered somewhat analogous to the frequency response of a pair of tuned circuits which is tuned to substantially different frequencies. In this respect, the slots of the tuning structure are considered as the equivalent of tuned circuits having fundamental frequencies whose wave lengths are equal to substantially four times the length of the slots. The other modes in each group result from combinations of the pluralities of slots which may be considered as a transmission line comprising the tuned circuits represented by the slots, said transmission line closing upon itself. Such a device will resonate at a plurality of frequencies, said frequencies being separated into two groups.

Other and further objects and advantages of this invention will become apparent as the description thereof progresses, reference being had to the accompanying drawings, wherein.

Figure 1:
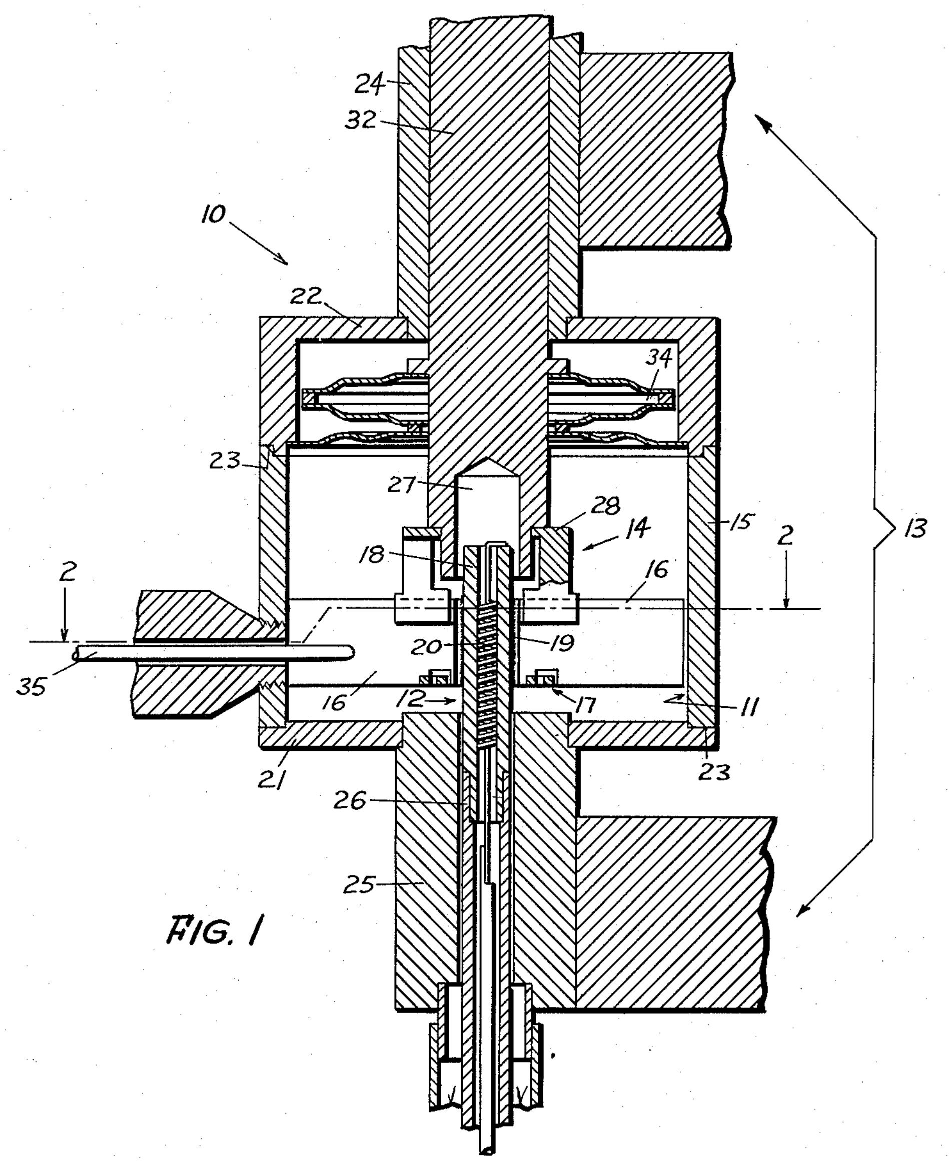
Fig. 1 illustrates a longitudinal, cross-sectional view of an electron-discharge device embodying this invention.
Figure 2:
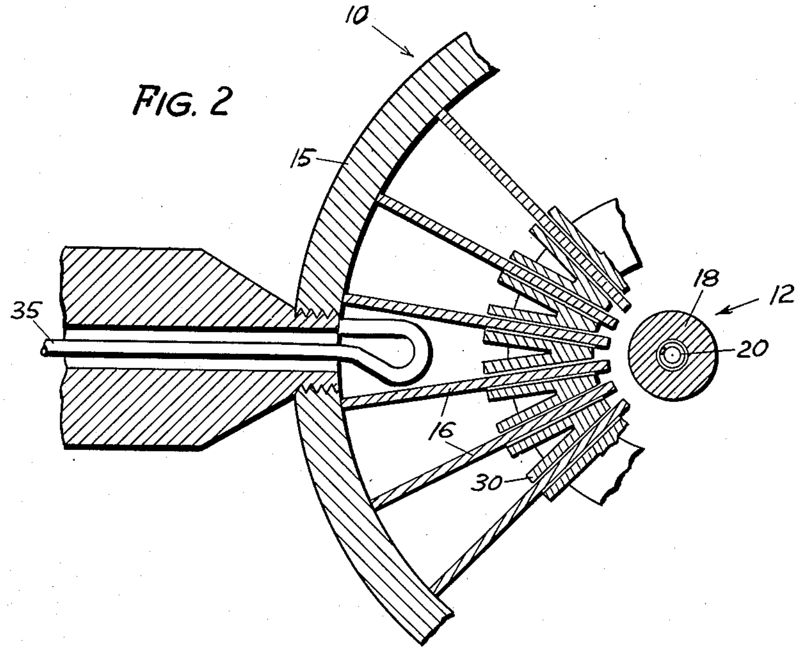
Fig. 2 illustrates a partially broken away, transverse, cross-sectional view of the device shown in Fig. 1, taken along line 2—2 of Fig. 1.
Figure 3:
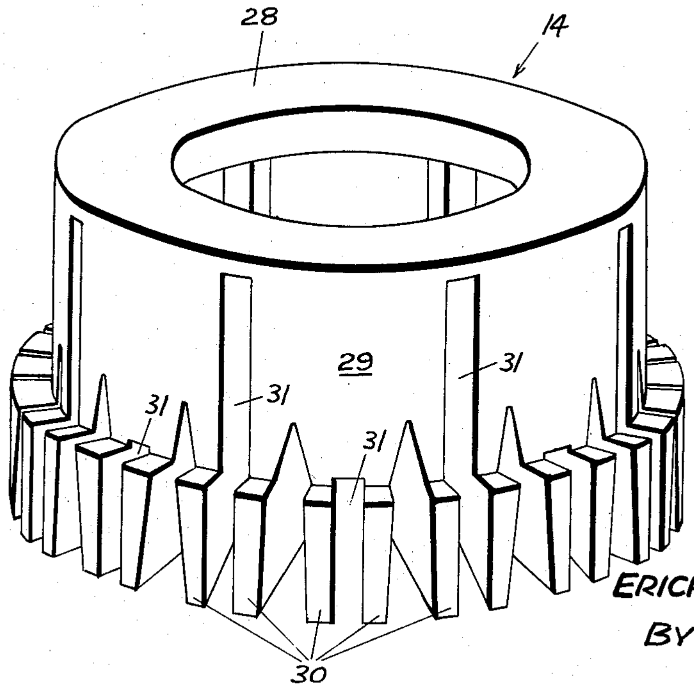
Fig. 3 illustrates a perspective view of the tuning structure used in the device, illustrated in Figs. 1 and 2.

Referring now more in detail to the aforementioned illustrated embodiment of the present invention, and with particular reference to the drawings illustrating the same, numeral 10 generally designates an electron-discharge device of the magnetron type having an anode structure 11, a cathode structure 12, magnetic means 13 for establishing the magnetic field in a direction perpendicular to the direction of electron flow between said cathode and anode structures, and a tuning means 14. In the device shown, the anode structure is of a well-known design, including a cylindrical body 15 of conductive material, such as copper, said body having attached thereto a plurality of radially disposed, inwardly extending anode members in the form of vanes 16, each pair of adjacent anode members, together with that portion of the cylindrical anode structure included therebetween, defining a resonant cavity.

In order to prevent certain spurious oscillations, alternate anode members are connected together at their inner ends by straps, as at 17, to maintain said alternate anode members at the same instantaneous potential.

A cathode structure 12 extending through the anode structure, and positioned concentrically therewith, comprises an electron-emissive material, as at 19, coated on a metal cylindrical rod 18. The cathode structure is heated by a heating element 20 extending through the center of said rod and insulated therefrom, and attached at its upper end to said rod, such that, by applying a potential between said cathode rod and a wire connected with the bottom of said heating element, the cathode may be raised to a suitable temperature for emission of electrons from the coating 19. The magnetron structure is enclosed by the anode cylindrical body 15, together with end plates 21 and 22 hermetically sealed to said cylinder, as at 23. Attached to said end plates are upper and lower magnetic pole pieces 24 and 25 which, in conjunction with the magnetic assembly 13, produce a flux across the cavity of the magnetron. Slidably mounted in the upper pole piece 24 is a rod of magnetic material 32 which may be moved with respect to said fixed pole piece by a mechanical arrangement such as is disclosed in my Patent No. 2,529,950, dated November 14, 1950. The magnetic rod is hollow at its lower end, as at 27, to accommodate the upper end of the cathode structure 12 which is positioned concentrically therewith.

Rigidly attached around and conforming to the lower end of said magnetic rod is a tuning structure 14, whereby, when the tuning structure is moved to vary the frequency of operation of the magnetron, the magnetic flux across the gap between the fixed lower pole piece and the movable magnetic rod which extends downwardly from the upper pole piece is also changed, changing the magnetic flux applied across the cavity of the magnetron. As is required for constant voltage and constant current operation, the magnetic flux is increased as the frequency is lowered.

Thus, it may be seen that the device will operate over a wide range of frequencies while maintaining a substantially constant anode voltage and current. This is advantageous, since the tube may be used in a power supply which is fixed, and, moreover, the problem of gang tuning the power supply voltage with the tuning element is eliminated.

The tuning element proper 14 comprises a ring 28 which is rigidly attached to a magnetic rod 32, ring 28 surrounding a reduced portion of magnetic rod 32. Extending downwardly from ring 28 is a cylindrical member 29 to the lower end of which are attached tuning elements 30. Each tuning element 30 has a V shape cross-section whose outer contour conforms to the space between a pair of anode vanes such that the apex of the V points toward the cathode 12 of the discharge device. There are spaces between adjacent ones of the tuning elements 30 sufficient to allow the anode vanes 16 to pass therebetween without contacting the tuning structure when the tuning structure is inserted into the cavity resonator defined by the magnetron anode. The spaces between adjacent ones of the tuning elements 30 are shown here by way of example as slots 31. Alternate slots 31 extend substantially the entire length of the cylindrical member 29 to the ring 28, while the slots 31 adjacent said alternate slots extend for a substantially smaller distance from the tuning elements 30. For example, as shown here, these slots extend only slightly into the cylindrical member 29.

During normal operation, the magnetron-discharge device oscillates at a $\pi$ mode resonance, the frequency of the $\pi$ mode resonance being determined by the equivalent inductance and capacitance of the cavities formed by the magnetron-anode structure. Insertion of the tuning structure 14 into the cavities increases the capacitance thereof, thereby lowering the operating frequency of the magnetron-discharge device. Due to the V shape of the cross-section of the tuning elements, eddy current or inductance tuning which produces frequency changes substantially opposite to those of capacitance tuning upon insertion of the cavities is kept to a minimum.

The cathode structure is hermetically sealed into the magnetron pole piece and insulated therefrom in a well-known manner, for example, as disclosed in the aforementioned Patent No. 2,529,950, dated November 14, 1950.

The tuning structure is hermetically and movably sealed into the magnetron by means of a triple diaphragm 34 which operates in an obvious manner, and as disclosed and shown in application, Serial No. 793,889 by Albert D. La Rue, filed December 26, 1947, entitled Mechanical Movement and which is now Patent No. 2,621,311, issued December 9, 1952.

Energy is coupled from the magnetron by means of a probe loop 35 inserted into one of the cavities through a gas-tight insulated seal in a well-known manner.

Thus, it may be seen that the electron-discharge device may be tuned over a wide range with low losses in the tuner, due to the nonresonant condition of the tuner at the operating frequency, and the absence of tuner conducting material in the inductive regions of the cavities, and with optimum efficiency and maximum stability, due to variation in magnetic flux in conjunction with frequency change.

This completes the description of the aforesaid illustrative embodiment of the present invention. While there has been herein described a preferred form of the invention, other embodiments thereof within the scope of the appended claims will be obvious to those skilled in the art from a consideration of the form shown and the teachings thereof.

What is claimed is:

1. An electron-discharge device comprising a cathode, an anode structure spaced from said cathode, said anode structure defining a cavity resonator having a plurality of cavities, and a tuning structure comprising a plurality of tuning elements movably positioned with respect to said cavity resonator, tuning elements of said tuning structure extending respectively, into different cavities of said resonator, adjacent tuning elements being separated from each other by spaces, adjacent ones of said spaces having different dimensions with respect to each other.

2. An electron-discharge device comprising a cathode, an anode structure spaced from said cathode, said anode structure defining a cavity resonator having a plurality of cavities, and a tuning structure comprising a plurality of tuning elements movably positioned with respect to said cavity resonator, tuning elements of said tuning structure extending, respectively, into different cavities of said resonator, adjacent tuning elements being separated from each other by slots, adjacent ones of said slots having different depths.

3. An electron-discharge device comprising a cathode, an anode structure spaced from said cathode, said anode structure defining a cavity resonator having a plurality of cavities, a tuning structure comprising a plurality of tuning elements movably positioned with respect to said cavity resonator, tuning elements of said tuning structure extending, respectively, into different cavities of said resonator, adjacent tuning elements being separated from each other by spaces, adjacent ones of said spaces having different dimensions with respect to each other, and means adjacent said anode structure for producing a magnetic field in the space between said cathode and said anode.

4. An electron-discharge device comprising a cathode, an anode structure spaced from said cathode, said anode structure defining a cavity resonator having a plurality of cavities, a tuning structure comprising a plurality of tuning elements movably positioned with respect to said cavity resonator, tuning elements of said tuning structure extending, respectively, into different cavities of said resonator, adjacent tuning elements being separated from each other by slots, adjacent ones of said slots having different depths, and means adjacent said anode structure for producing a magnetic field in the space between said cathode and said anode.

5. An electron-discharge device comprising a cathode, an anode structure spaced from said cathode, said anode structure defining a cavity resonator having a plurality of cavities, and a tuning structure comprising a plurality of tuning elements movably positioned with respect to said cavity resonator adjacent said cathode, tuning elements of said tuning structure extending, respectively, into different cavities of said resonator, adjacent tuning elements being separated from each other by spaces, adjacent ones of said spaces having different dimensions with respect to each other.

6. An electron-discharge device comprising a cathode, an anode structure spaced from said cathode, said anode structure defining a cavity resonator having a plurality of cavities, and a tuning structure comprising a plurality of tuning elements movably positioned with respect to said cavity resonator adjacent said cathode, tuning elements of said tuning structure extending, respectively, into different cavities of said resonator, adjacent tuning elements being separated from each other by slots, adjacent ones of said slots having different dimensions with respect to each other.

7. An electron-discharge device comprising a cathode, an anode structure spaced from said cathode, said anode structure defining a cavity resonator having a plurality of cavities, and a tuning structure comprising a plurality of tuning elements movably positioned with respect to said cavity resonator in the high capacity area of said cavities, tuning elements of said tuning structure extending, respectively, into different cavities of said resonator, adjacent tuning elements being separated from each other by spaces, adjacent ones of said spaces having different dimensions with respect to each other.

8. An electron-discharge device comprising a cathode, an anode structure spaced from said cathode, said anode structure defining a cavity resonator having a plurality of cavities, a tuning structure comprising a plurality of tuning elements movably positioned with respect to said cavity resonator, tuning elements of said tuning structure extending, respectively, into different cavities of said resonator, adjacent tuning elements being separated from each other by spaces, adjacent ones of said spaces having different dimensions, a rod of magnetic material movably positioned with respect to said cavity resonator and positioned adjacent thereto, and means connected to said rod for moving said rod in conjunction with said tuning structure.

9. An electron-discharge device comprising a cathode, an anode structure spaced from said cathode, said anode structure defining a cavity resonator having a plurality of cavities, a tuning structure comprising a plurality of tuning elements movably positioned with respect to said cavity resonator in the high capacity area of said cavities adjacent said cathode, tuning elements of said tuning structure extending, respectively, into different cavities of said resonator, adjacent tuning elements being separated from each other by slots, adjacent ones of said slots having different depths, a rod of magnetic material movably positioned with respect to said cavity resonator and positioned adjacent thereto, and means connected to said rod for moving said rod in conjunction with said tuning structure.

References Cited in the file of this patent

UNITED STATES PATENTS

| | | |
|---|---|---|
| 2,450,619 | Sonkin | Oct. 5, 1948 |
| 2,508,576 | Kusch | May 23, 1950 |

FOREIGN PATENTS

| | | |
|---|---|---|
| 588,185 | Great Britain | May 16, 1947 |